United States Patent [19]
Hartmann et al.

[11] Patent Number: 5,628,855
[45] Date of Patent: May 13, 1997

[54] METHOD OF PICKING UP AN ELECTRIC DEVICE

[75] Inventors: Juergen Hartmann; Guenter Boeer; Walter Weinstock, all of Reutlingen, Germany

[73] Assignee: Robert Bosch GmbH, Stuttgart, Germany

[21] Appl. No.: 410,192

[22] Filed: Mar. 24, 1995

[30] Foreign Application Priority Data

Mar. 24, 1994 [DE] Germany ............... 44 10 179.1

[51] Int. Cl.$^6$ ........................................ B44C 1/165
[52] U.S. Cl. .................... 156/235; 156/344; 438/464
[58] Field of Search ................ 428/901; 437/226; 156/235, 236, 237, 344, 241

[56] References Cited

U.S. PATENT DOCUMENTS

| | | | |
|---|---|---|---|
| 4,644,639 | 2/1987 | Atteberry et al. | 29/589 |
| 4,921,564 | 5/1990 | Moore | 156/344 |
| 4,941,255 | 7/1990 | Bull | 156/235 |
| 5,030,308 | 7/1991 | Sheyon | 156/235 |
| 5,098,501 | 3/1992 | Nishiguchi | 156/344 |
| 5,362,681 | 11/1994 | Roberts, Jr. | 437/226 |
| 5,383,997 | 1/1995 | Minowa | 156/235 |

OTHER PUBLICATIONS

Coombs, Printed Circuits Handbook, 3rd. Ed 1988, pp. 27.2–27.7, 3.20–3.21, 3.8–3.9, 3.10–3.11, 3.20–3.21 3.28–3.31.

Primary Examiner—Patrick Ryan
Assistant Examiner—Patrick Jewik
Attorney, Agent, or Firm—Kenyon & Kenyon

[57] ABSTRACT

A method of picking up an electric device which is detachably connected by its underside on a mount, by means of a holding tool. First, a second mount is detachably fastened on the upper side of the electric device such that the holding force between the electric device and the second mount is greater than the holding force between the first mount and the electric device. Next, the first mount is separated from the electric device. Finally, the electric device is picked up, on its underside, from the second mount by the holding tool.

12 Claims, 1 Drawing Sheet

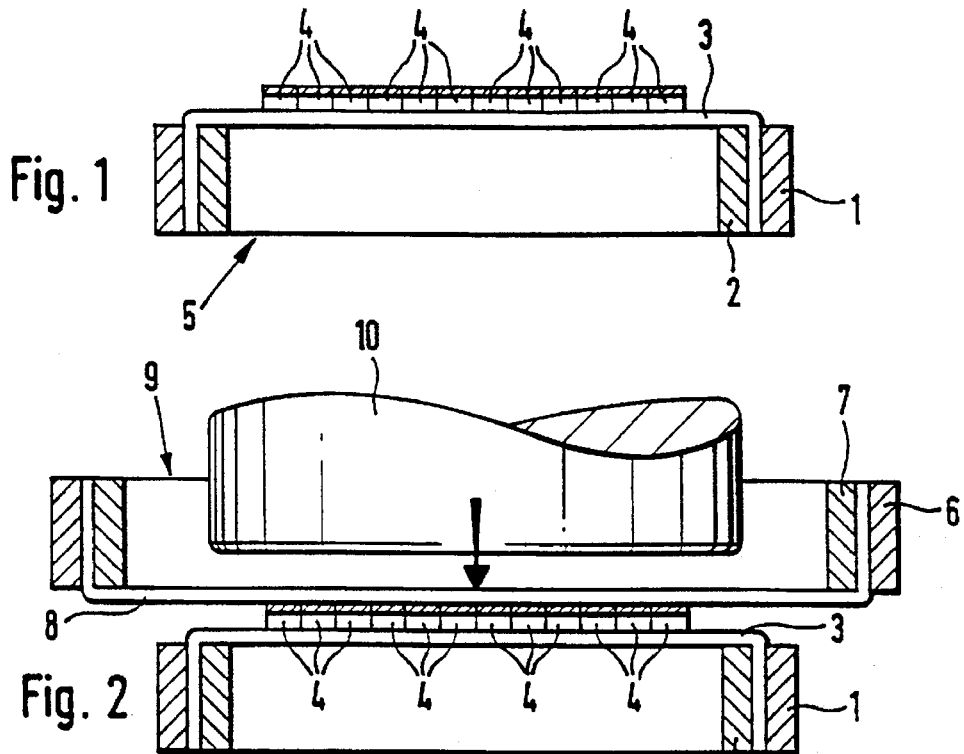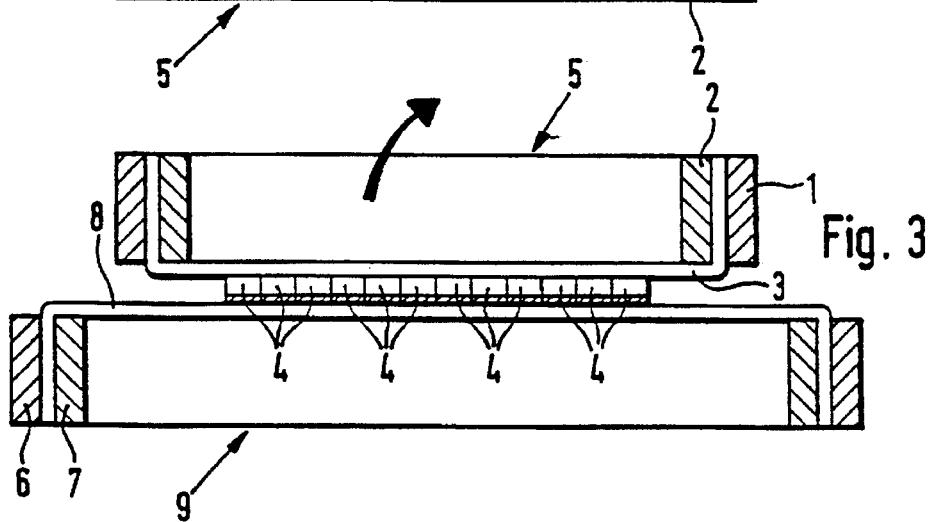

METHOD OF PICKING UP AN ELECTRIC DEVICE

BACKGROUND OF THE INVENTION

The present invention concerns a method for picking up an electric device which is detachably fastened, by its underside, to a first mount. During the production process of semiconductors on a semiconductor wafer (for example of silicon), an electric circuit is produced on the surface of the wafer on only one side of the semiconductor wafer. The structures produced thereby include contact elements, by which the integrated circuit can be connected to further circuits. The individual integrated circuits (chips) are adhesively bonded onto a substrate and the contact elements are provided with wires which lead to further contacts.

In the so-called "flip-chip" technique, the chip is applied to a substrate with the circuit side downward. The substrate includes conductor paths which contact the contact elements of the chip when the chip is lying in place. In known flip-chip methods, until now, a chip with the circuit side facing upward has been lifted from its substrate by a holding tool, turned over individually so that its circuit side faces down, and set down at its intended place on the substrate. Picking up and turning over each individual chip in such known flip-chip methods constitutes a procedure which expends time and materials. Thus, there is a need for a method for producing "flip-chips" which overcomes the inefficiencies of the known methods.

SUMMARY OF THE INVENTION

The method of the present invention simplifies the production of flip-chips by providing a method for picking up an electric device which is detachably fastened, by its underside, on a first mount, including steps of detachably fastening a second mount on the upper side of the electric device such that the holding force between the second mount and the electric device is greater than the holding force between the first mount and the electric device, separating the first mount from the electric device, and picking up the electric device, on its underside, from the second mount with a holding tool. Thus, the method of the present invention advantageously significantly simplifies the effort for making the underside of the chip accessible. In addition, with the method of the present invention, a plurality of chips can be treated simultaneously, thereby saving effort and time.

Using a carrier sheet as the second mount minimizes damage to the electric device during fastening on the second mount because of the flexibility of the sheet.

Pressing the carrier sheet onto the electric device with a pressing stamp advantageously increases the adherence of the electric device to the carrier sheet thereby reducing the probability of the electric device falling off the carrier sheet unintentionally.

Moving the second mount with the electric device, before the first mount is removed into a position in which the electric device lies above the second mount, preferably horizontally, is particularly advantageous since the probability of the device falling off the second mount is reduced.

Reducing the holding force of the second mount before the electric device is to be removed advantageously permits the electric device to be lifted off the second mount with less force, thereby reducing the risk of damage. Reducing the holding force of the carrier sheet by illuminating it with light constitutes a particularly rapid and simple method of reducing the holding force. Using UV light as the light controlling the holding force advantageously eliminates unintentionally exposing the carrier sheet to ambient light.

Arranging a plurality of electric devices on a common mount advantageously saves material because only one mount has to be provided for a plurality of devices.

Segregating defective elements before detachably fastening the second mount on the upper side of the electric device advantageously avoids further processing defective devices because later segregation of the defective devices involves increased effort.

A further advantage is provided when the method is used for semiconductor wafers and the wafer is divided up into individual chips before the first method step because the dividing operation from the circuit side of the wafer offers a greater yield of operational chips.

BRIEF DESCRIPTION OF THE DRAWINGS

Exemplary embodiments of the present invention are explained in more detail in the following description and are represented in the drawings.

FIG. 1 shows a cross-sectional side view of a first mount with a wafer.

FIG. 2 shows a cross-sectional side view of a wafer between two mounts and a forming stamp.

FIG. 3 shows a cross-sectional view of a wafer between two mounts.

FIG. 4 shows a cross-sectional view of a wafer on a second mount with a holding tool.

DETAILED DESCRIPTION

In FIG. 1, a hollow-cylindrical first outer frame 1 is arranged around a hollow-cylindrical first inner frame 2. A first carrier sheet 3 is stretched over the first inner frame 2 on one side and is pressed by a radially inner surface of the first outer frame 1 against a radially outer surface of the first inner frame 2. The first outer frame 1 and the first inner frame 2 consequently together form a cylinder which is open on one side and which has one covered surface formed by the first carrier sheet 3. The first outer frame 1, the first inner frame 2 and the first carrier sheet 3 together form a first mount 5.

A plurality of electric devices 4 are detachably fastened, by their underside, to an outer side of the first carrier sheet 3. The electric devices 4 are held on the first carrier sheet 3 by a holding force which is produced by an adhesive surface (for example, by a layer of adhesive). The arrangement represents, by way of example, a semiconductor wafer which has been fastened on the first mount 5 and then sawn into individual electric devices 4. Based on this arrangement, the electric devices 4 are picked up in the following method.

FIG. 2 represents the first step of the method of the present invention. A second mount 9 comprises a hollow-cylindrical second inner frame 7 and a hollow-cylindrical second outer frame 6, arranged around the second inner frame 7, and a second carrier sheet 8, which is stretched over the second inner frame 7. The second outer frame 6 and the second inner frame 7 form a cylinder which is open on one side. The second carrier sheet 8 forms a covering surface closing a second side of the cylinder formed by second inner frame 7 and second outer frame 6.

In a first method step, the outer side of the second carrier sheet 8 of the second mount 9 is laid onto the upper side of the electric devices 4. A pressing stamp 10 then presses the inner side of the second carrier sheet 8 such that the outer side of the second carrier is pressed against the upper side of the electric devices 4. This improves the surface contact between electric devices 4 and the second carrier sheet 8, whereby the force of adhesion of the second carrier sheet 8, provided on its outer side with a layer of adhesive, onto the surface of the upper side of the electric devices 4 is intensified. The force of adhesion, or holding force, between the second carrier sheet 8 and the upper side of the electric devices 4 is, in this case, greater than the holding force between the underside of the electric devices 4 and the first carrier sheet 3.

FIG. 3 represents the second step of the method of the present invention. The arrangement comprising first mount 5, second mount 9 and electric devices 4 arranged in between is turned (i.e., flipped 180°), so that the first mount 5 lies above the second mount 9. By a tilting movement (in the direction of the arrow), the first mount 5 is lifted off from the then upward-facing underside of the electric devices 4. This is possible because, as explained above, the holding force between the electric devices 4 and the first carrier sheet 5 is less than the holding force between the electric devices 4 and the second carrier sheet 8. Consequently, the downward-lying upper side of the electric devices 4 remain adhering to the outer side of the second carrier sheet 8.

In FIG. 4 the third method stop is represented. After the first mount 5 is removed, the upward-lying underside of the electric devices 4 is accessible for a holding tool 12, such as a suction tube, for example. With this holding tool 12, each individual electric device 4 can then be gripped, or sucked up, on its underside, and lifted off from the second carrier sheet 8 and can be transported to where it is to be set down as a flip-chip.

In this example, the second carrier sheet 8 is provided with a layer of adhesive, the holding force of which can be reduced by exposure to light for example. Before the electric devices 4 are lifted off by means of the holding tool 12, the second carrier sheet 8 is therefore irradiated with light 11 from its underside, whereby the lifting off by means of the holding tool 12 is facilitated. Preferably, sheets which are sensitive to UV light can be used, so that the procedure can take place without sacrificing holding force under normal illumination.

Since, in the upside-down position, checking the operability of the electric circuits 4 is difficult, it is preferable to test the electric circuits 4 before the first method step (i.e., before the second mount is detachably fastened to the electric devices). In such a test, defective electric devices 4 are usually marked by an ink spot. There are then two possibilities for evaluating the information on the operability of the electric devices 4 during the subsequent assembly process. In the case of a first method, the position of the operational or inoperational electric devices 4 is stored in a computer and is fed to the positioning computer for the holding tool 12, so that only the operational electric devices 4 are removed from the second carrier sheet 8. In a simpler second method, the inoperational electric devices 4 are lifted off from the first carrier sheet 3 by a presorting tool even before the first method step.

The method described here is similarly suitable for assembling SMDs (surface mounted devices) while they are awaiting further processing, for example after a metallization process in which metal contacts have been applied to the upper side of the SMDs, and the SMDs are however to be set down on a circuit board with the metallization downward.

What is claimed is:

1. A method for picking up an electric device having an upper side and an underside, the electric device being detachably fastened, by its underside, on a first mount, the method comprising steps of:
    a) dividing a semiconductor wafer into individual chips, a single chip being used as the electric device;
    b) detachably fastening a second mount on the upper side of the electric device such that a holding force between the second mount and the electric device is greater than a holding force between the first mount and the electric device;
    c) separating the first mount from the electric device; and
    d) picking up the electric device, by its underside, from the second mount by means of a holding tool, the upper side of the electric device attachable to a substrate when the electric device is separated from the second mount.

2. The method of claim 1 wherein the second mount has a carrier sheet on which the electric device adheres.

3. The method of claim 2 wherein the step of detachably fastening includes the sub-step of pressing the carrier sheet against the electric device by means of a pressing stamp.

4. The method of claim 1 further comprising a step of moving the second mount, with the electric device, into a position in which the electric device lies above the second mount before the step of picking up.

5. The method of claim 4 wherein the position to which the electric device and second mount is moved is horizontal.

6. The method of claim 1 further comprising a step of reducing the holding force between the second mount and the electric device before the step of picking up.

7. The method of claim 6 wherein the step of reducing the holding force includes a sub-step of exposing the carrier sheet, wherein the holding force of the carrier sheet has a greater holding force in the unexposed state than in the exposed state.

8. The method of claim 7 wherein the holding force of the carrier sheet is controllable by UV light and wherein the step of reducing the holding force includes a sub-step of irradiating the carrier sheet with UV light.

9. The method of claim 1 further comprising a step of arranging a plurality of electric devices together on the first mount before the step of detachably fastening.

10. The method of claim 9 further comprising steps of:
    checking the plurality of electric devices on the first mount to determine whether each of the plurality of electric devices is operable; and
    detaching any of the plurality of electric devices from the first mount which are found to be unoperational by the step of checking,
wherein the steps of checking and detaching are performed before the step of detachably fastening.

11. The method of claim 1, wherein the first mount is situated at a first initial position, and wherein the second mount is situated at a second initial position.

12. The method of claim 11, further comprising the step of:
    rotating the first mount and the second mount before the step of separating the first mount from the electric device to position the first mount at a first final position and the second mount at the second final position, the first final position being substantially equal to the second initial position and the second final position being substantially equal to the first initial position.

* * * * *